(12) United States Patent
Nakagawa et al.

(10) Patent No.: US 7,541,738 B2
(45) Date of Patent: Jun. 2, 2009

(54) DISPLAY UNIT AND MANUFACTURING METHOD THEREOF

(75) Inventors: Ryo Nakagawa, Kanagawa (JP);
Shinichiro Morikawa, Aichi (JP);
Yuichi Iwase, Kanagawa (JP)

(73) Assignee: Sony Corporation, Tokyo (JP)

( * ) Notice: Subject to any disclaimer, the term of this patent is extended or adjusted under 35 U.S.C. 154(b) by 473 days.

(21) Appl. No.: 11/208,676

(22) Filed: Aug. 22, 2005

(65) Prior Publication Data

US 2006/0043888 A1    Mar. 2, 2006

(30) Foreign Application Priority Data

Aug. 31, 2004  (JP)  ............................. 2004-251715

(51) Int. Cl.
*H05B 33/00* (2006.01)
*H01J 1/62* (2006.01)
(52) U.S. Cl. ...................... 313/506; 313/503; 313/504; 313/505
(58) Field of Classification Search ......... 313/495–512; 315/169.3, 169.4; 257/40, 79; 428/690; 345/30, 36, 44, 45
See application file for complete search history.

(56) References Cited

FOREIGN PATENT DOCUMENTS

| JP | 2001-093661 | 6/2001 |
|----|-------------|--------|
| JP | 2003-086358 | 3/2003 |
| JP | 2003-243153 | 8/2003 |
| JP | 2003-272860 | 9/2003 |

OTHER PUBLICATIONS

Office Action issued in corresponding Japanese Patent Application, JP 2004-251715.

*Primary Examiner*—Joseph L Williams
*Assistant Examiner*—Elmito Breval
(74) *Attorney, Agent, or Firm*—Sonnenschein Nath & Rosenthal LLP

(57) ABSTRACT

A display unit in which viewing angle characteristics such as color shift and luminance unevenness depending on the viewing angle are improved and a manufacturing method thereof are provided. A display unit includes a driving panel having a plurality of light emitting devices arranged in a grid on a device substrate, a sealing panel including a sealing substrate, and a transparent resin layer which is sandwiched between the sealing panel and the driving panel. The transparent resin layer has a thickness $L_1$ satisfying Mathematical formula 1

$$L_1 \leq \frac{\{(L_{PITCH} - L_{CF}) + (L_{CF} - L_{EL})/2\} + HK}{\tan\{\sin^{-1}\left(\frac{1}{n}\right)\}}.$$

13 Claims, 7 Drawing Sheets

DISPLAY UNIT AND MANUFACTURING METHOD THEREOF

CROSS REFERENCES TO RELATED APPLICATIONS

The present invention contains subject matter related to Japanese Patent Application JP 2004-251715 filed in the Japanese Patent Office on Aug. 31, 2004, the entire contents of which being incorporated herein by reference.

BACKGROUND OF THE INVENTION

1. Field of the Invention

The present invention relates to a display unit having a transparent resin layer between a driving panel and a sealing panel and a manufacturing method thereof.

2. Description of the Related Art

In recent years, as one of flat panel displays, an organic light emitting display using organic light emitting devices has been noted. The organic light emitting display has characteristics that the viewing angle is wide and the power consumption is low since it is a self-luminous type display. Further, the organic light emitting display is also thought of as a display having sufficient response to high-definition high-speed video signals, and is under development toward the practical use.

As a material for an organic light emitting layer constructing the organic light emitting device, there are a low molecular weight material and a high molecular weight material. Currently, in view of light emitting efficiency and long lifetime, research and development of the organic light emitting display including the organic light emitting layer made of a low molecular weight material is actively implemented.

In such an organic light emitting display including a red organic light emitting layer, a green organic light emitting layer, and a blue organic light emitting layer for each of three primary colors of light has disadvantages such that a spectrum peak width of light extracted from each organic light emitting layer is wide and color purity (degree of saturation) is low. Further, in such an organic light emitting layer including a single color (white) organic light emitting layer has a disadvantage such that it is difficult to emit three primary colors only by the organic light emitting layer emitting a single color. Therefore, the color reproduction range for a current TV monitor or the like is not practically satisfied. By providing a color filter in the light extraction direction, the color reproduction range is magnified, the single light emission is separated into three primary colors, and outside light reflection is decreased.

A color filter is preferably used for a top emission type organic light emitting display in which light is extracted from the sealing substrate side in view of flexible design of TFT (Thin Film Transistor) and high aperture ratio of the pixel.

However, in the top emission type organic light emitting display in which a device substrate on which the organic light emitting devices are formed and a sealing substrate on which the color filter is provided are bonded together, a gap depending on the thickness of a resin or the like is generated between the organic light emitting devices and the color filter. Therefore, there have been shortcomings that other color is leaked from the adjacent color filter, luminance balance is lost, and color difference (color shift) is caused particularly in a wide viewing angle. To address these shortcomings, a method has been suggested in which a transparent resin layer is provided between the organic light emitting devices and the color filter, the thickness of the transparent resin layer is equal to or less than the distance between pixels of the organic light emitting devices (for example, refer to Japanese Unexamined Patent Application Publication No. H05-94878).

SUMMARY OF THE INVENTION

However, in order to prevent color shift caused by leak of other color from the adjacent color filter, it is not sufficient to set the thickness of the transparent resin layer equal to or less than the distance between pixels of the organic light emitting devices. Further, there is a thickness difference (film thickness unevenness) between the thinnest portion and the thickest portion in the transparent resin layer. Therefore, there has been a disadvantage that variation of the amount of light shielded by a black matrix provided on the sealing substrate is visually observed as luminance unevenness at a wider viewing angle. This detracts visual quality especially of white color.

In view of the foregoing disadvantages, it is desirable to provide a display unit in which such characteristics as color shift and luminance unevenness are improved and a manufacturing method thereof. According to an embodiment of the present invention, there is provided a display unit including: a driving panel having a plurality of light emitting devices arranged in a grid on a device substrate; a sealing panel including a sealing substrate; and a transparent resin layer which is sandwiched between the sealing panel and the driving panel and has a thickness $L_1$ satisfying Mathematical formula 1. The thickness of the transparent resin layer is $L_1$ satisfying Mathematical formula 1.

$$L_1 \leq \frac{\{(L_{PITCH} - L_{CF}) + (L_{CF} - L_{EL})/2\} + HK}{\tan\{\sin^{-1}\left(\frac{1}{n}\right)\}}$$

Specifically, red, green, and blue light emitting devices are arranged in a first direction of the grid and concolorous light emitting devices are arranged in a second direction of the grid. In addition, all light emitting devices may be white light emitting devices or blue light emitting devices. Further, two or more light emitting units may be layered with an insulating charge generation layer therebetween.

According to an embodiment of the present invention, there is provided a method of manufacturing a display unit including a driving panel having a plurality of light emitting devices arranged in a grid on a device substrate, a sealing panel having a sealing substrate, and a transparent resin layer, in which the driving panel and the sealing panel are adhered with the transparent resin layer so that the transparent resin layer has a thickness $L_1$ satisfying Mathematical formula 1.

In such a display in which the transparent resin layer has the thickness satisfying Mathematical formula 1, color leak from the adjacent color filter or the adjacent color conversion film and variation of the amount of light shielded by black matrix provided on the sealing substrate are inhibited.

According to the display unit and the method of manufacturing a display unit of an embodiment of the present invention, the thickness of the transparent resin layer between the both panels is set to satisfy Mathematical formula 1. Therefore, color leak from the adjacent color filter or the adjacent color conversion film and variation of the amount of light shielded by black matrix provided on the sealing substrate are inhibited. As a result, at wider view angle, color leak from other color filter is reduced, and the amount of light shielded by the black matrix becomes uniform.

Other and further objects, features and advantages of the invention will appear more fully from the following description.

DETAILED DESCRIPTION OF THE PREFERRED EMBODIMENT

An embodiment of the present invention will be hereinafter described in detail with reference to the drawings.

Figure 1:
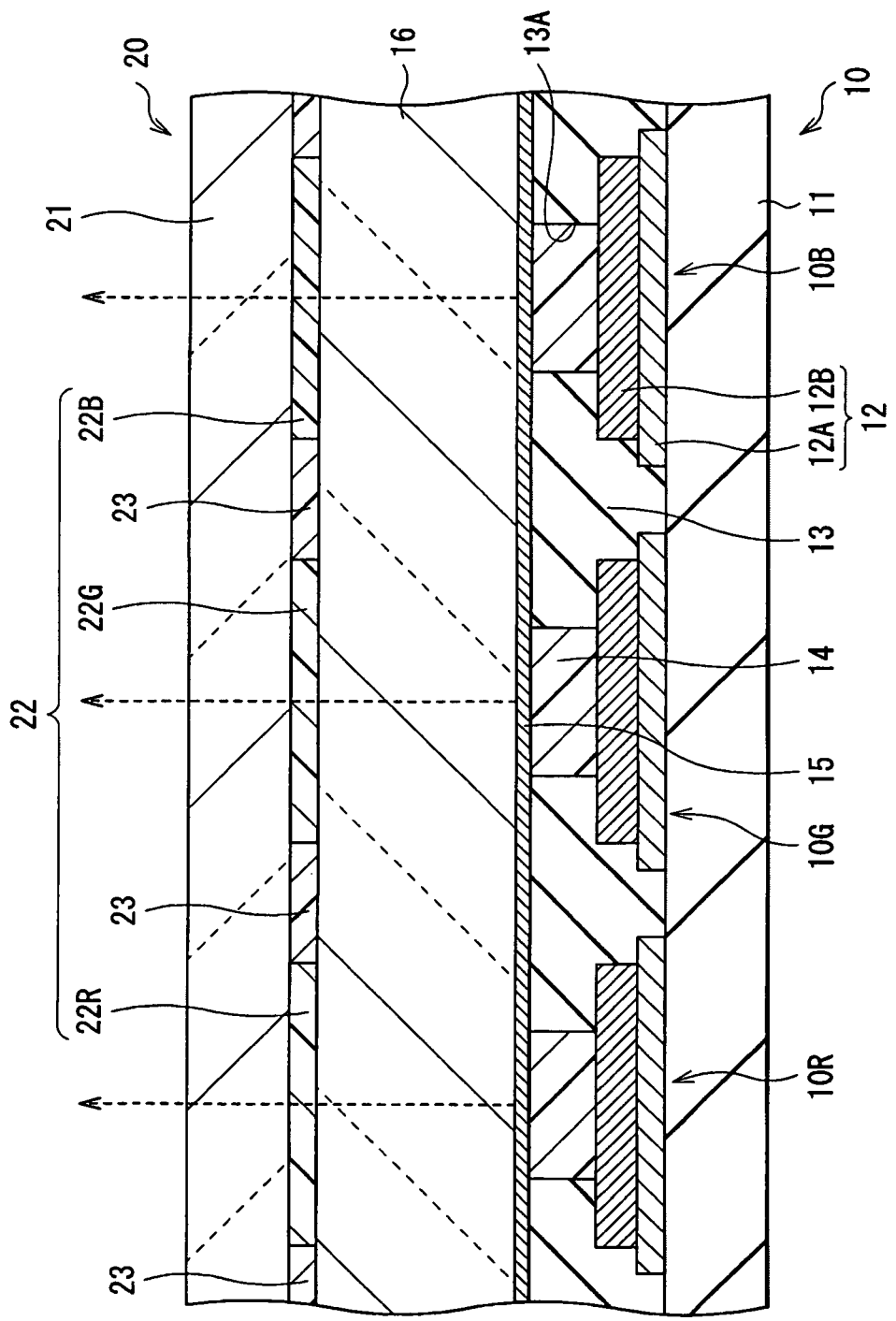
FIG. 1 is a cross section showing a configuration of a display unit according to an embodiment of the present invention.

FIG. 1 shows a cross section structure of a display unit according to the embodiment of the present invention. In the display unit, a driving panel 10 and a sealing panel 20 are oppositely arranged, and the surfaces of which are bonded together by an after-mentioned transparent resin layer 16. In the driving panel 10, for example, a plurality of organic light emitting devices are arranged in a grid on a device substrate 11 made of an insulating material such as glass with an unshown TFT and an unshown planarized layer inbetween. In a line direction of the grid arrangement (first direction), red, green, and blue organic light emitting devices (10R, 10G, and 10B) are arranged. In a column direction (second direction), the concolorous organic light emitting devices are arranged.

In the organic light emitting devices 10R, 10G, and 10B, for example, a first electrode 12 as an anode, an insulating layer 13, an organic layer 14 including a light emitting layer, and a second electrode 15 as a cathode are layered in this order from the device substrate 11 side sandwiching the unshown TFT and the unshown planarized layer. The transparent resin layer 16 is formed on the second electrode 15. A protective film may be formed between the second electrode 15 and the transparent resin layer 16 according to need.

In the first electrode 12, for example, a contact layer 12A and a metal layer 12B are sequentially layered from the device substrate 11 side.

The contact layer 12A prevents the metal layer 12B from being separated from the device substrate 11. The contact layer 12A is preferably made of, for example, a metal, a conductive oxide, or a metal compound containing at least one from the metal element group consisting of chromium (Cr), indium (In), tin (Sn), zinc (Zn), cadmium (Cd), titanium (Ti), aluminum (Al), magnesium (Mg), and molybdenum (Mo). Such materials have high electric conductivity, and provides good electric junction with the unshown TFT. The film thickness in the laminated direction of the contact layer 12A (hereinafter simply referred to as film thickness) is about a thickness capable of maintaining contact characteristics of the metal layer 12B, for example, 5 nm or more.

The metal layer 12B also has a function as a reflective layer. It is desirable that the metal layer 12B has high reflectance as far as possible in order to improve light emitting efficiency. In this embodiment, the metal layer 12B is made of, for example, silver (Ag), an alloy containing silver, aluminum, or an alloy containing aluminum. In particular, it is preferable that the metal layer 12B is made of silver, which has the highest reflectance among metals or an alloy containing silver, since light absorption loss in the metal layer 12B can be reduced.

The insulating layer 13 is intended to secure insulation between the first electrode 12 and the second electrode 15, and to accurately make a desired shape of light emitting regions in the organic light emitting devices 10R, 10G, and 10B. The insulating layer 13 has, for example, a film thickness of about 600 nm, and is made of an insulating material such as silicon oxide and polyimide. The insulating layer 13 is provided with an aperture 13A corresponding to the light emitting regions in the organic light emitting devices 10R, 10G, and 10B.

The construction of the organic layer 14 varies according to light emitting colors of the organic light emitting devices 10R, 10G, and 10B. In the organic layer 14 of the organic light emitting devices 10R and 10B, an electron hole transport layer, a light emitting layer, and an electron transport layer, which are not shown, are layered in this order from the first electrode 12 side. The electron hole transport layer is intended to improve efficiency to inject electron holes into the light emitting layer. Further, it is possible that the electron hole transport layer also functions as an electron hole injection layer. The light emitting layer is intended to generate light by electron-hole recombination caused by applying electric field. Light is emitted in the region corresponding to the aperture of the insulating layer 13. The electron transport layer is intended to improve efficiency to inject electrons into the light emitting layer.

The electron hole transport layer of the organic light emitting device 10R (not shown) has, for example, a film thickness of about 45 nm, and is made of bis[(N-naphthyl)-N-phenyl] benzidine α-NPD). The light emitting layer of the organic light emitting device 10R (not shown) has, for example, a film thickness of about 50 nm, and is made of 2,5-bis [4-[N-(4-metoxyphenyl)-N-phenylamino]]styrilbenzen-1,4-dicarbonitrile (BSB). The electron transport layer of the organic light emitting device 10R (not shown) has, for example, a film thickness of about 30 nm, and is made of 8-quinolinole aluminum complex ($Alq_3$).

The electron hole transport layer of the organic light emitting device 10B (not shown) has, for example, a film thickness of about 30 nm, and is made of .alpha.-NPD. The light emitting layer of the organic light emitting device (not shown) has, for example, a film thickness of about 30 nm, and is made of 4,4-bis(2,2'-diphenylbinin)biphenyl (DPVBi). The electron transport layer of the organic light emitting device 10B (not shown) has, for example, a film thickness of about 30 nm, and is made of Alq$_3$.

Further, the organic layer 14 of the organic light emitting device 10G has a structure in which an electron hole transport layer and a light emitting layer (which are not shown) are layered in this order from the first electrode 12 side. The electron hole transport layer also functions as an electron hole injection layer, and the light emitting layer also functions as an electron transport layer.

The electron hole transport layer of the organic light emitting device 10G has, for example, a film thickness of about 50 nm, and is made of α-NPD. The light emitting layer of the organic light emitting device 10G has, for example, a film thickness of about 60 nm, and is made of a substance in which 1 volume % of coumarin 6 (C6) is mixed in Alq$_3$.

The second electrode 15 is formed of a semi-transparent electrode. Light generated in the light emitting layer is extracted from the second electrode 15 side. The second electrode 15 has, for example, a film thickness of about 10 nm, and is made of a metal or an alloy of silver, aluminum, magnesium, calcium (Ca), sodium (Na) or the like. In this embodiment, the second electrode 15 is made of an alloy of magnesium and silver (MgAg alloy). The second electrode 15 is formed to cover all of the organic light emitting devices 10R, 10G, and 10B and is a common electrode of the organic light emitting devices 10R, 10G, and 10B.

The transparent resin layer 16 according to this embodiment is formed of a thermosetting adhesive, a photo cured adhesive or the like made of an epoxy material, acrylic material or the like having a refractive index in the range from 1.3 to 2.2. Thereby, the driving panel 10 and the sealing panel 20 can be bonded together, the difference between the refractive index of the transparent resin layer 16 and the refractive index of the adjacent layer such as a sealing substrate 21 can be decreased, and interference between the transparent resin layer 16 and the sealing substrate 21 can be eased.

Figures 2A, 2B:
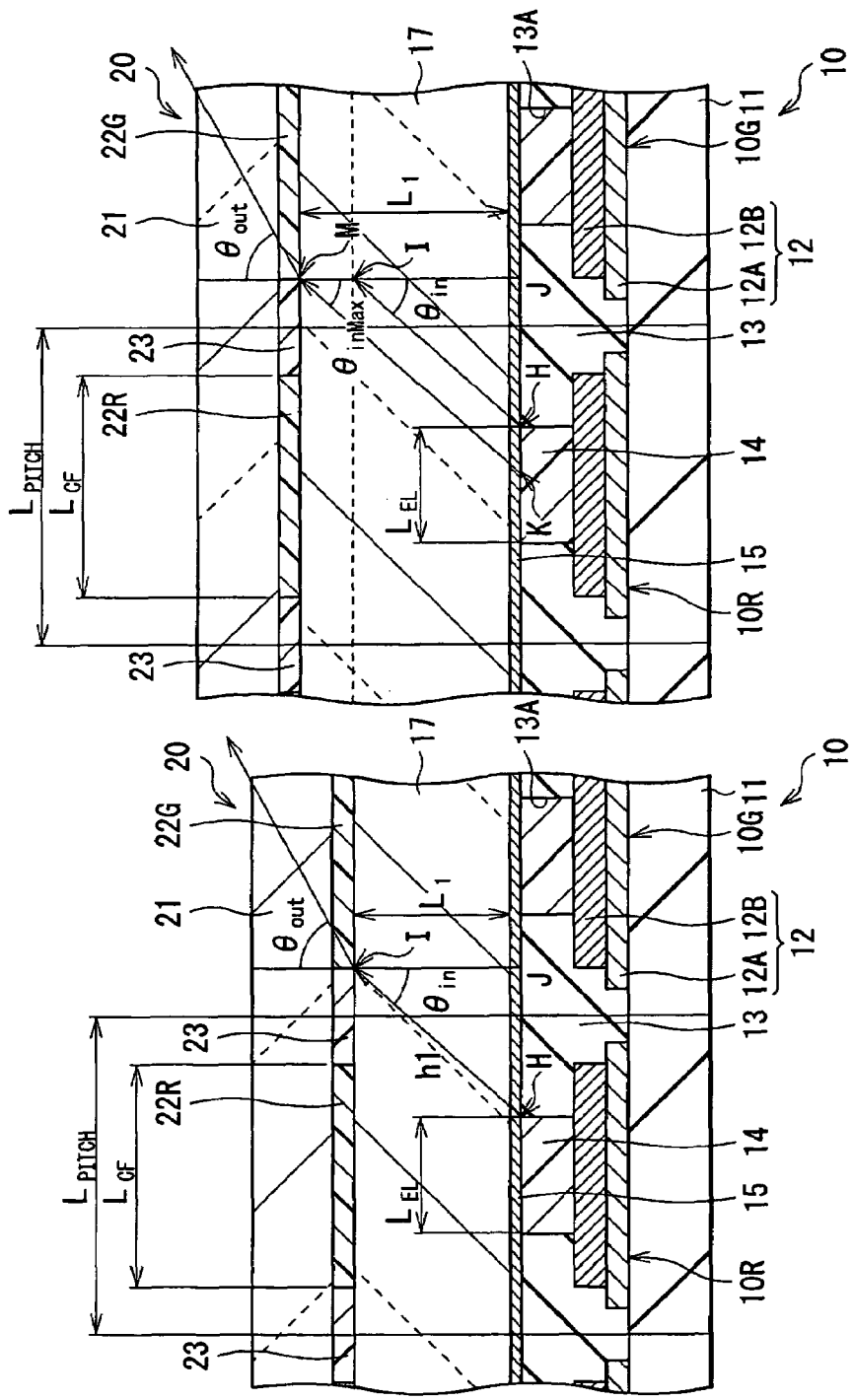
FIGS. 2A and 2B are cross sections showing enlarged parts of the configuration of the display unit shown in FIG. 1.

Further, as shown in FIG. 2A, a thickness $L_1$ of the transparent resin layer 16 is set in the range specified by Mathematical formula 2 so as to inhibit light leak by, for example, light h1 emitted from the organic light emitting device 10R. A length in the line direction of the color filter 22R is $L_{CF}$, a length between the center of the width of a black matrix 23 between the color filter 22R and the color filter 22B, and the center of the width of the black matrix 23 between the color filter 22R and the color filter 22G is $L_{PITCH}$, a length in the line direction of the organic layer 14 is $L_{EL}$, an end of the organic light emitting device 10R on the side to which the organic light emitting device 10G is adjacent is H, an end of the black matrix 23 between the color filter 22R and the color filter 22G on the side where the black matrix 23 is adjacent to the color filter 22G is I, an intersection of a normal line from the end I and a top face of the insulating layer 13 is J (intersection J), an angle HIJ (incident angle) is $\theta_{in}$, an angle (emission angle) made by an extension line on the end I side of a segment IJ and emission light h2 is $\theta_{out}$, and a refractive index of the transparent resin layer 16 is n. A distance HJ is expressed as HJ={$(L_{PITCH}-L_{CF})+(L_{CF}-L_{EL})/2$}

$$L \leq \frac{\{(L_{PITCH} - L_{CF}) + (L_{CF} - L_{EL})/2\}}{\tan\left\{\sin^{-1}\left(\frac{1}{n}\right)\right\}} \quad \text{Mathematical formula 2}$$

The formula expressed by Mathematical formula 2 is obtained as follows. First, the emission angle $\theta_{out}$ expressed by Mathematical formula 3 is obtained based on Snell's law. In this embodiment, $n_0$ is a refractive index of outside air (air), and $n_0$ is 1.

$$\theta_{out} = \sin^{-1}\left(\frac{n_o}{n}\sin\theta_{in}\right) \quad \text{Mathematical formula 3}$$

Further, a relation of Mathematical formula 4 is obtained from a triangle HIJ. When Mathematical formula 4 is transformed, the incident $\theta_{in}$ expressed by Mathematical formula 5 is obtained.

$$\tan\theta_{in} = \frac{HJ}{L_1} \quad \text{Mathematical formula 4}$$

$$(HJ = \{(L_{PITCH} - L_{CF}) + (L_{CF} - L_{EL})/2\})$$

$$\theta_{in} = \frac{\{(L_{PITCH} - L_{CF}) + (L_{CF} - L_{EL})/2\} + HK}{\tan\left\{\sin^{-1}\left(\frac{1}{n}\right)\right\}} \quad \text{Mathematical formula 5}$$

Subsequently, the obtained Mathematical formula 5 is substituted for Mathematical formula 3. Then, in order to prevent the emission light h2 from being leaked, the emission angle $\theta_{out}$ is set to a critical angle, that is, 90°. Thereby, Mathematical formula 2 is obtained.

As above, it is ideal if light from a geometric light path HI can be shielded. However, for example, when a constant light expressed by the sum of light from the organic light emitting device 10R normally transmitted through the color filter 22R and light leaked from the adjacent color filter 22G is viewed, the constant light is not recognized as color shift since humans have low visibility to color mixture. Therefore, as shown in FIG. 2B, the thickness of the transparent resin layer 16 can be increased to the degree that light leak is generated from inside of the organic light emitting device 10R (area expressed by length of HK×length of the organic layer 14 in the column direction, K is a point at the opposite end of the organic light emitting device where H is located). That is, the thickness of the transparent resin layer 16 can include somewhat extra portion in addition to the minimum thickness of the transparent resin layer 16 expressed by Mathematical formula 2.

By making a correction by including the foregoing extra portion, for the thickness $L_1$ of the transparent resin layer 16, the upper limit value can be set as expressed in Mathematical formula 1.

In other words, compared to the thickness $L_1$ expressed by Mathematical formula 2, the portion of HK/tan{sin$^{-1}$(1/n)} is extra allowed for the thickness. Thereby, defects such as color shift and luminance unevenness depending on the viewing angle can be reduced.

The range of color shift $\Delta_{u'v'}$ can be obtained as follows.

Regarding pixels in the column direction, the concolorous pixels are arranged. Therefore, it is difficult to visually observe color shift when the display is viewed from the wide viewing angle in the column direction. However, pixels in the line direction are adjacent to other two color pixels. Therefore, when the display is viewed from the wide viewing angle in the line direction, color shift is easily visually observed.

Further, when the thickness of the transparent resin layer 16 is increased, the volume of light shielded by the black matrix is increased. Therefore, luminance is decreased, and luminance unevenness is visually observed.

The color shift $\Delta_{u'v'}$ in this embodiment specifies that the in-plane color difference of the sealing panel is in the range of $\Delta_{u'v'}$.1toreq.0.006. Such a color difference range is the range, in which color shift is hardly observed visually, and good image display is enabled in the color shift range. Further, an allowable range of the above-mentioned incident angle $\theta_{inMAX}$ satisfies the color shift range.

Further, for the transparent resin layer 16, the thickness difference between the thinnest portion and the thickest portion is preferably 10 µm or less. Thereby, the amount of light shielded by the black matrix 23 can be uniform, luminance unevenness is improved, and viewing angle characteristics are further improved.

As shown in FIG. 1, the sealing panel 20 is located on the second electrode 15 side of the driving panel 10, and has the sealing substrate 21 to seal the organic light emitting devices 10R, 10G, and 10B. The sealing substrate 21 is made of a material such as glass, which is transparent to the light generated in the organic light emitting devices 10R, 10G, and 10B. The sealing substrate 21 is provided with, for example, the color filter 22 and the black matrix 23. The color filter 22 extracts the light generated in the organic light emitting devices 10R, 10G, and 10B, absorbs outside light reflected in the organic light emitting devices 10R, 10G, and 10B and the wirings therebetween, and improves contrast. The black matrix 23 segments the color filter 22, and prevents above-mentioned light leak or the like.

The color filter 22 may be provided on either side of the sealing substrate 21. However, it is preferable to provide the color filter 22 on the driving panel 10 side, since the color filter 22 is not be exposed on the surface, and can be protected by the transparent resin layer 16. The color filter 22 has a red filter 22R, a green filter 22G, and a blue filter 22B, which are orderly arranged corresponding to the organic light emitting devices 10R, 10G, and 10B.

The red filter 22R, the green filter 22G, and the blue filter 22B are formed, for example, in the shape of a rectangle are made of a resin mixed with a pigment, respectively. The red filter 22R, the green filter 22G, and the blue filter 22B are adjusted so that light transmittance in the targeted red, green, or blue wave length band becomes high and light transmittance in other wave length bands becomes low by selecting a pigment.

The display unit can be manufactured as follows, for example.

Figure 3:
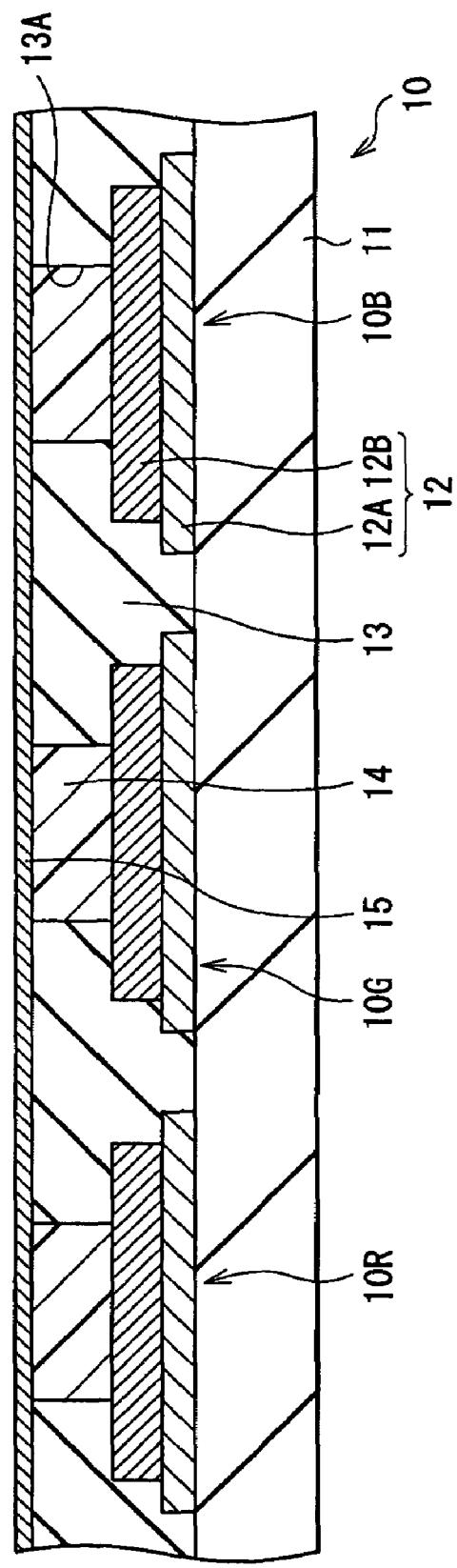
FIG. 3 is a cross section showing a method of manufacturing the display unit shown in FIG. 1 in the order of steps.

First, as shown in FIG. 3, on the device substrate 11 made of the foregoing material, on which the unshown TFT and the unshown fattening layer are formed, the contact layer 12A made of the foregoing material and having the foregoing film thickness is formed by, for example, sputtering method.

After that, the first electrode 12 is formed by providing the metal layer 12B made of the foregoing material and having the foregoing thickness on the contact layer 12A by, for example, sputtering method.

Next, the insulating layer 13 made of the foregoing material and having the foregoing thickness is deposited over the whole area of the device substrate 11 by, for example, CVD (Chemical Vapor Deposition) method. An aperture 13A is formed by selectively removing the portion of the insulating layer 13 corresponding to the light emitting region by using, for example, lithography technique.

Subsequently, the organic layer 14 of the organic light emitting devices 10R, 10G, and 10B, which is made of the foregoing material and having the foregoing film thickness is formed by, for example, deposition method.

After the organic layer 14 of the organic light emitting devices 10R, 10G, and 10B is formed, the second electrode 15 made of the foregoing material and having the foregoing film thickness is formed over the whole area of the device substrate 11 by, for example, deposition method. Consequently, the driving panel 10 is completed.

Figure 4A:
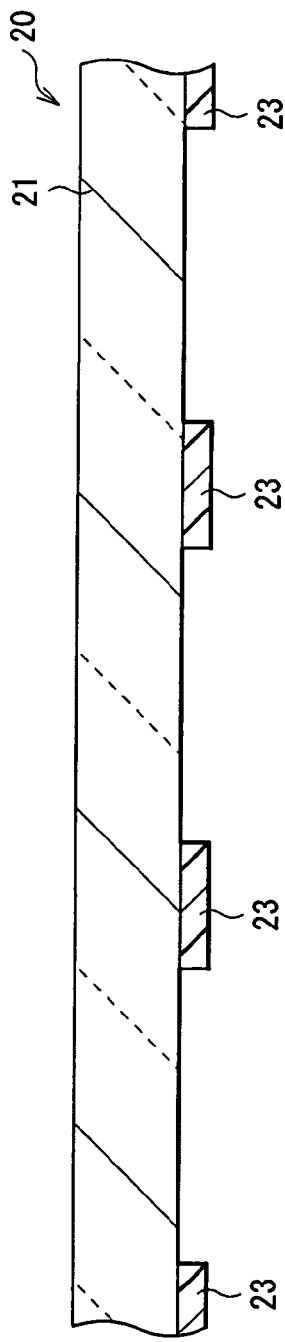
FIGS. 4A, 4B, and 4C are cross sections showing steps following the step of FIG. 3.
Figure 4B:
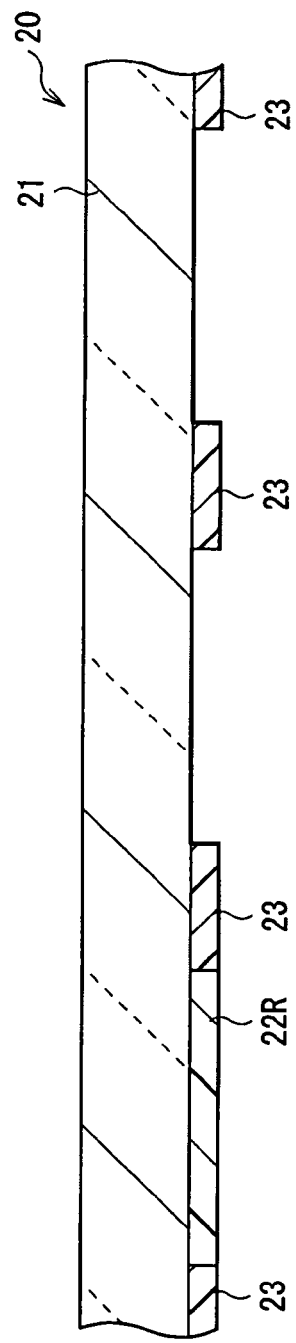
Figure 4C:
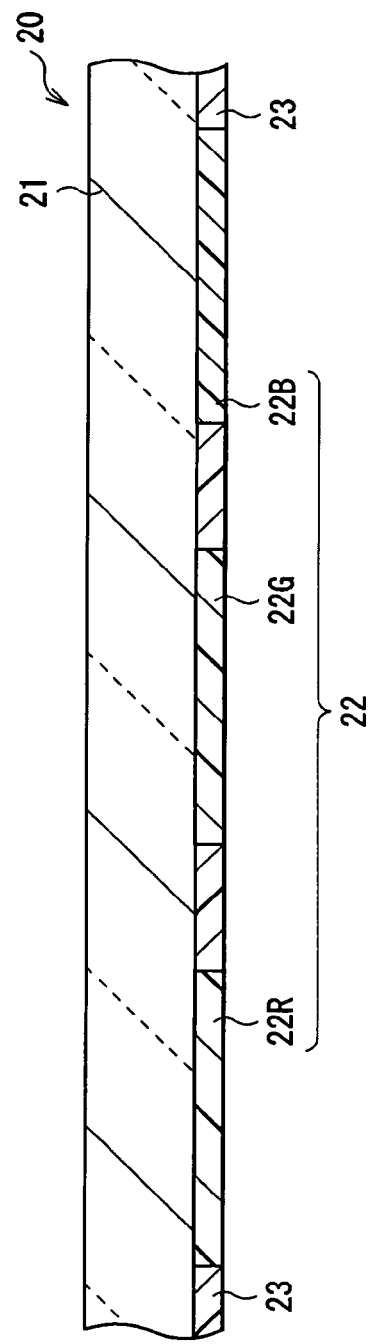

Meanwhile, as shown in FIG. 4A, for example, the black matrix 23 is formed on the sealing substrate 21 made of the foregoing material. After that, as shown in FIG. 4B, the red filter 22R is formed by, for example, coating with a material for the red filter 22R by spin coating or the like, and patterning by photolithography technique and firing. Subsequently, as shown in FIG. 4C, as in the red filter 22R, the blue filter 22B and the green filter 22G are sequentially formed. The sealing panel 20 is thereby completed.

After that, by complete solid sealing method or the like, the transparent resin layer 16 is formed by using the foregoing material on the second electrode 15 so that the thickness in the range expressed in Mathematical formula 1 can be obtained, and concurrently, the driving panel 10 and the sealing panel 20 are bonded together. Here, "complete solid sealing method" is the method of sealing so that a hollow structure is not formed between the driving panel 10 and the sealing panel 20. Specifically, the driving panel 10 is coated with the foregoing thermosetting adhesive or the foregoing photo cured adhesive by using a dispenser. After that, the foregoing adhesive is solidified by heating process or ultraviolet irradiation. Thereby, forming the transparent resin layer 16 and boding the driving panel 10 and the sealing panel 20 are concurrently performed. In the complete solid sealing method, no hollow structure is formed. Therefore, panel strength and light extraction efficiency, in particular, light extraction efficiency in the top emission display is improved. Further, in the complete solid sealing method, an absorbent or the like necessary for can sealing method is not needed. The display unit shown in FIGS. 1, 2A, and 2B is thereby completed. In addition to the complete solid sealing method, vacuum sealing method, spin-coating method or the like can be used.

In the display unit, when a given voltage is applied between the first electrode 12 and the second electrode 15, a current is injected in the light emitting layer (not shown) in the organic layer 14, electron holes and electrons recombine with each other, and thereby light is generated. The light is multiple-reflected between the first electrode 12 and the second electrode 15, transmitted through the second electrode 15, and extracted. In this embodiment, the thickness of the transparent resin layer 16 is in the range expressed in Mathematical formula 1, and therefore color leak from the adjacent color filter 22 in the line direction is inhibited. Further, the thickness difference between the thinnest portion and the thickest portion of the transparent resin layer 16 is set to 10 µm or less, and thereby the amount of light shielded by the black matrix 23 provided on the sealing substrate 21 becomes uniform, luminance unevenness is inhibited, and viewing angle characteristics are improved.

EXAMPLES

Further, specific examples of the present invention will be described in detail.

Example 1

In Example 1, the relation between the thickness of the transparent resin layer 16 and the viewing angle in which color shift is visually observed was examined by using Mathematical formula 1. Here, descriptions will be given with reference to FIGS. 1, 2A, and 2B.

Figure 5:
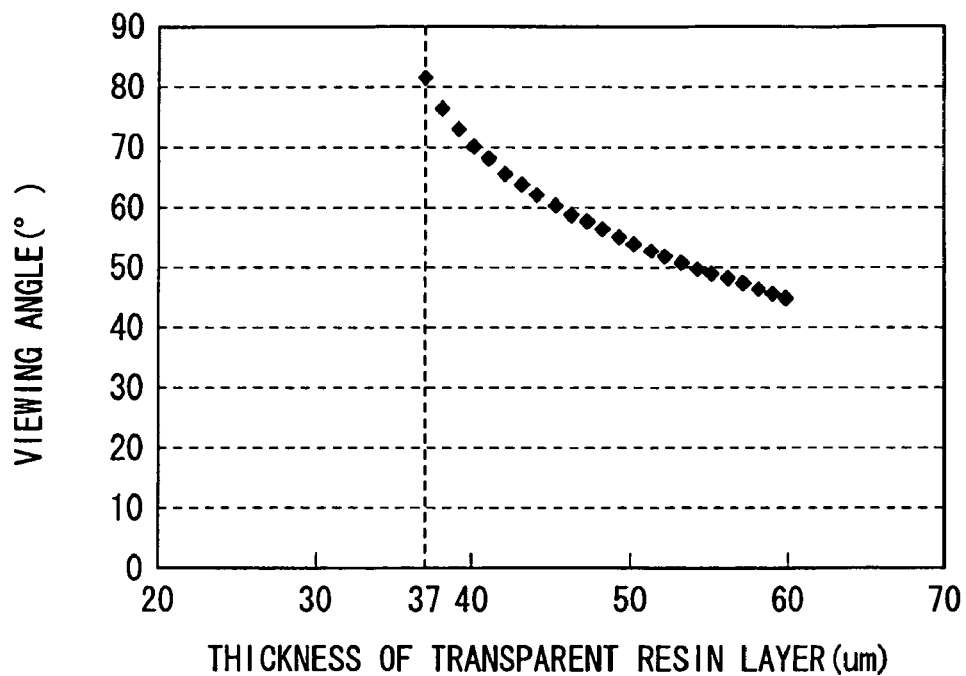
FIG. 5 is a view showing a relation between thicknesses of a transparent resin layer of a display unit according to Example 1 of the present invention and viewing angles, in which color shift is visually observed.

Specifically, the relation between the thickness of the transparent resin layer 16 and the viewing angle in which color shift was visually observed in the case where $L_{PITCH}$ was 56 μm, $L_{CF}$ was 39 μm, $L_{EL}$ was 31 μm, the refractive index n of the transparent resin layer 16 was 1.57, and the refractive index of outside air was 1 was examined. In addition, the maximum thickness $L_1$ of the transparent resin layer 16, in which color shift was not visually observed was obtained by Mathematical formula 1. The results are shown in FIG. 5. From the reason described in the foregoing embodiment, evaluation of color shift in the line direction was conducted.

As shown in FIG. 5, in the display unit in Example 1, at viewing angle 75°, the maximum thickness $L_1$ of the transparent resin layer 16, in which color shift was not visually observed was 37 μm. When the thickness of the transparent resin layer 16 was 37 μm or less, color shift was not visually observed. Based on the result, a display unit was actually fabricated. Then, color shift of the fabricated display unit was evaluated, and no color shift was visually observed.

Examples 2-1 to 2-3

In Examples 2-1 to 2-3, display units in which sizes of $L_{PITCH}$, $L_{CF}$, and $L_{EL}$ and the refractive index of the transparent resin layer 16 were similar to of the display unit of Example 1, and the thickness of the transparent resin layer 16 was varied to 29 μm, 32 μm, and 36 μm were fabricated. Chromaticity at viewing angle 75° in the column direction, in which color is not leaked from other color filter and chromaticity at viewing angle 75° in the line direction, in which color is leaked from other color filter were measured. Then, the color difference between the chromaticity in the column direction and the chromaticity in the line direction, that is, color shift was obtained, and color shift to the thickness of the transparent resin layer 16 was evaluated. The results are shown in FIG. 6.

As Comparative examples 2-1 to 2-3 of Examples 2-1 to 2-3, display units were fabricated as in Examples 2-1 to 2-3, except that the thickness of the transparent resin layer 16 was varied to 38 μm, 39 μm, or 41 μm, and the fabricated display units were evaluated. The results are also shown in FIG. 6.

Figure 6:
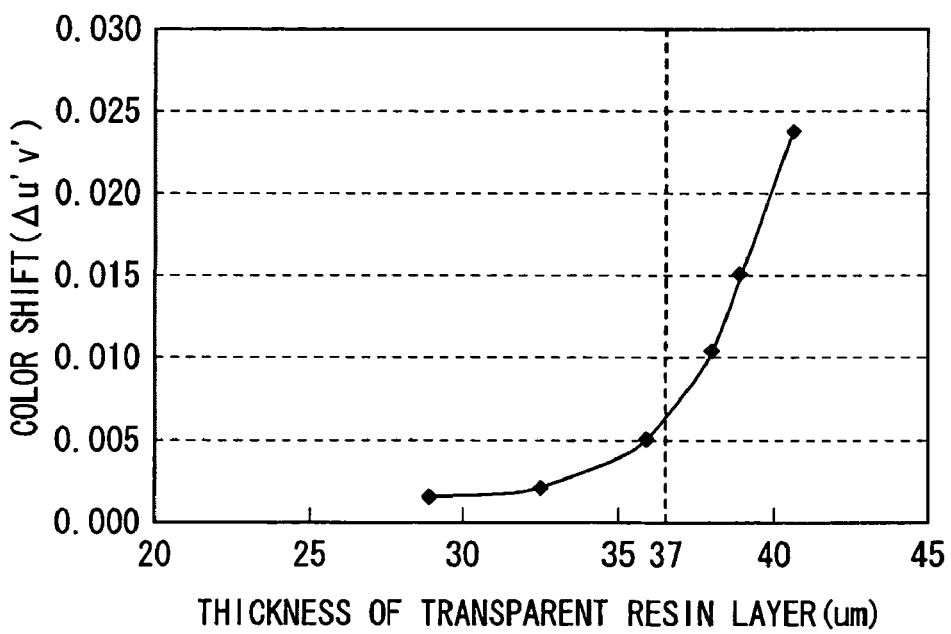
FIG. 6 is a view showing color shift to thicknesses of transparent resin layers of display units according to Examples 2-1 to 2-3 and Comparative examples 2-1 to 2-3 of the present invention.

As shown in FIG. 6, in the display unit in which the thickness of the transparent resin layer 16 was 37 μm or less, color shift was in the range of $\Delta_{u'v'} \leq 0.006$, and color shift was not visually observed.

Examples 3-1 and 3-2

Figure 7:
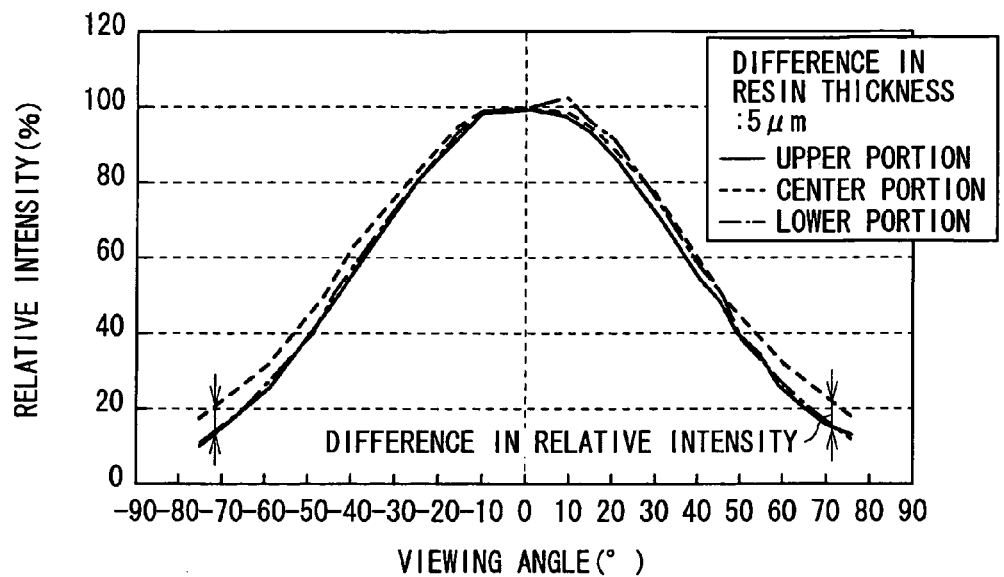
FIG. 7 is a view showing relative intensity to viewing angles in the upper portion, the center portion, and the lower portion in the column direction in the center of the line direction of a display unit according to Example 3-1 of the present invention.
Figure 8:
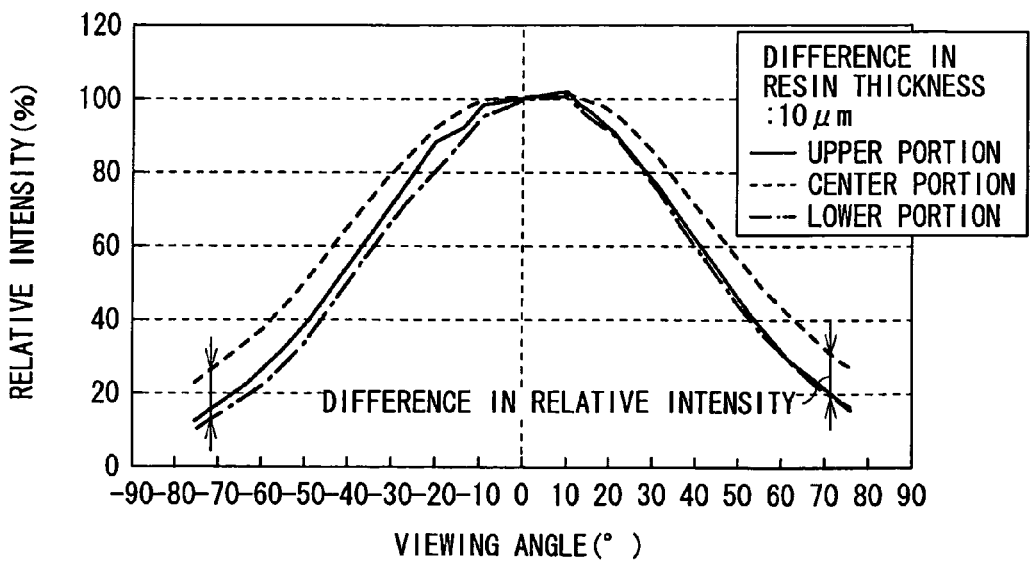
FIG. 8 is a view showing relative intensity to viewing angles in the upper portion, the center portion, and the lower portion in the column direction in the center of the line direction of a display unit according to Example 3-2 of the present invention.

In Examples 3-1 and 3-2, display units were fabricated as in Examples 2-1 to 2-3, except that the difference between the thickest portion and the thinnest portion of the transparent resin layer 16 was varied to 5 μm or 10 μm. Regarding the upper portion, the center portion, and the lower portion in the column direction in the center of the line direction of the fabricated display unit, relative intensity to the viewing angle was measured, and thereby luminance unevenness was evaluated. Here, the relative intensity in the examples means a ratio of luminance of each viewing angle where luminance at viewing angle 0° (front face of the sealing panel) is 100%. In particular, the relative intensity at viewing angle 75° is obtained by relative intensity (%) at viewing angle 75°={luminance at viewing angle 75°/luminane at viewing angle 100° (front face of the sealing panel)}×100. The results are shown in FIG. 7 and FIG. 8. The viewing angles on the left side from the center of the line direction of the display unit are indicated by a symbol −.

As Comparative example 3-1 of Examples 3-1 and 3-2, a display unit was fabricated as in Examples 3-1 and 3-2, except that the difference between the thickest portion and the thinnest portion of the transparent resin layer 16 was changed to 20 μm. For the fabricated display unit of Comparative example 3-1, the relative intensity to the viewing angle was measured as in Examples 3-1 and 3-2. The results are shown in FIG. 9.

Figure 9:
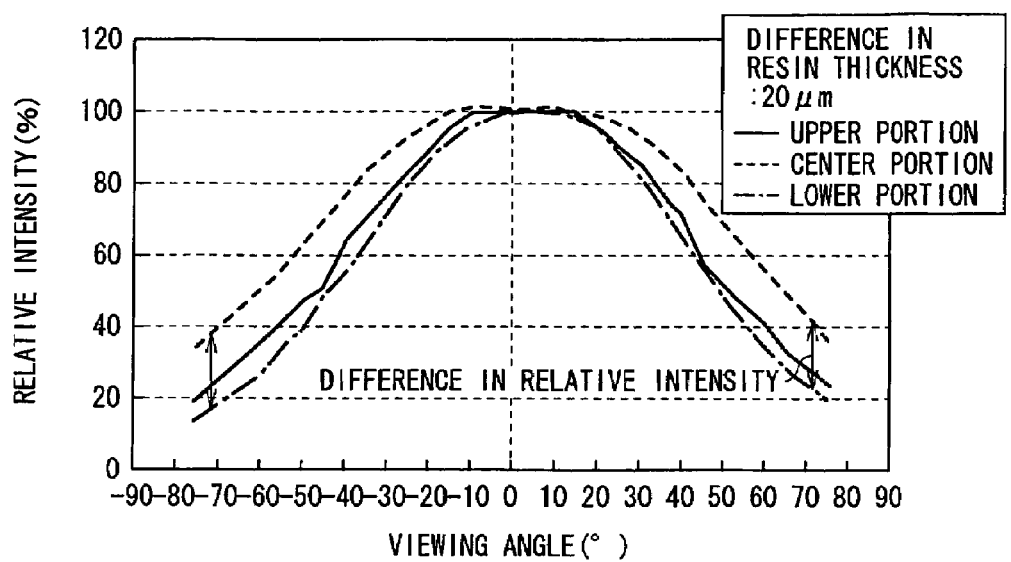
FIG. 9 is a view showing relative intensity to viewing angles in the upper portion, the center portion, and the lower portion in the column direction in the center of the line direction of a display unit according to Comparative example 3-1 of the present invention.

When Example 3-1 shown in FIG. 7, Example 3-2 shown in FIG. 8, and Comparative example 3-1 shown in FIG. 9 are compared, it was found that as the difference between the thickest portion and the thinnest portion of the transparent resin layer 16 was increased, the difference of relative intensity was increased. In particular, in the display unit in which the difference between the thickest portion and the thinnest portion of the transparent resin layer 16 was 5 μm, a difference in the relative intensity between the center portion and the lower portion at viewing angle 75° was about 5%. Further, in the display unit shown in FIG. 8, in which the difference between the thickest portion and the thinnest portion of the transparent resin layer 16 was 10 μm, a difference in the relative intensity between the center portion and the lower portion at viewing angle 75° was about 10%. Meanwhile, in the display unit shown in FIG. 9, in which the difference between the thickest portion and the thinnest portion of the transparent resin layer 16 was 20 μm, a difference in the relative intensity between the center portion and the lower portion at viewing angle 75° was about 15%. In the result, luminance unevenness was visually observed in the display unit in which the difference between the thickest portion and the thinnest portion of the transparent resin layer 16 was 10 μm or more.

While the invention has been described with reference to the embodiment, the invention is not limited to the foregoing embodiment, and various modifications may be made. For example, in the foregoing embodiment, the case where the first electrode 12 has two layers, that is, the contact layer 12A and the metal layer 12B has been described. However, the present invention can be applied to the case where the first electrode 12 does not have the contact layer 12A but has only the metal layer 12B.

Further, materials, film thicknesses, deposition methods, and deposition conditions of the respective layers are not limited to the materials, film thicknesses, deposition methods, and deposition conditions of the respective layers, which have been described in the foregoing embodiment. Other materials, thicknesses, deposition methods, and deposition conditions may be applied. For example, the second electrode 15 is not necessarily a semi-transparent electrode, but a transparent electrode. In addition, the contact layer 12A can be formed not only by using sputtering method, but also deposition method, CVD method, MOCVD (Metal Organic Chemical Vapor Deposition) method, laser ablation method, plating method or the like. The metal layer 12B can be formed not only by sputtering method, but also deposition method, CVD method, MOCVD method, laser ablation method, plating method or the like as well.

Further, in the foregoing embodiment and examples, the constructions of the organic light emitting devices 10R, 10G, and 10B have been described with reference to the specific examples. However, it is not necessary to include all layers such as the insulating layer 13, and it is possible to further include other layer. As specific other layer, for example, a protective film may be provided on the second electrode 15. Then, the protective film may be made of a transparent dielectric material such as silicon oxide ($SiO_2$) and silicon nitride (SiN). Then, when the film thickness of the protective film is 5 μm or more, viewing angle characteristics could be decreased. Therefore, when the protective film having a thickness of 5 μm or more is provided, it is preferable that the transparent resin layer 16 having a thickness obtained by subtracting the thickness of the protective film from the value specified by Mathematical formula 1 or Mathematical formula 2 is formed.

Further, it is possible that the interface on the light emitting layer side of the first electrode 12 is set to a first end (not shown), the interface on the light emitting layer side of the second electrode 15 is set to a second end (not shown), the organic layer 14 is set to a resonate section to construct a resonator structure to improve light extraction efficiency.

Further, though in the foregoing embodiment and examples, descriptions have been given of the display unit including three color light emitting devices, that is, the organic light emitting devices 10R, 10G, and 10B, the present invention can be applied to other type of display units.

That is, instead of the foregoing organic light emitting devices 10R, 10G, and 10B, the present invention can be applied to (1) the case where all light emitting devices are white light emitting devices, (2) the case where all light emitting devices are blue light emitting devices, (3) the case where all light emitting devices include layered two or more light emitting units and an insulating charge generation layer between the light emitting units MPE (Multi-Photon Emission) light emitting device. In these cases, as in the foregoing embodiment, the thickness of the transparent resin layer 16 can be specified by the range of Mathematical formula 1 or Mathematical formula 2. Thereby, in the light emitting devices in the case of (1) to (3), emitted light is not leaked from the region of the adjacent color filter or the like not facing to the light emitting device, and therefore generation of color shift, luminance unevenness and the like can be inhibited.

In the display unit including the white light emitting devices in the case of (1), color display is enabled by arranging red, green, and blue color filters in the line direction and arranging concolorous color filters in the column direction correspondingly to the positions where the white light emitting devices are arranged in the region segmented by black matrix on the sealing substrate.

In the display unit having blue light emitting devices in the case of (2), color display is enabled by arranging red and green conversion layers and blue light transmission regions in the line direction and arranging concolorous conversion layers or transmission regions in the column direction correspondingly to the positions where the blue light emitting devices are arranged in the region segmented by black matrix on the sealing substrate.

In the display unit having MPE light emitting devices in the case of (3), the foregoing two or more light emitting units are layered between an anode (first electrode) and a cathode (second electrode). In this case, as in usual organic light emitting devices, the light emitting unit has a structure in which an electron hole injection layer, an electron hole transport layer, a light emitting layer, an electron transport layer and the like are layered in this order from the anode side. The light emitting layer may include a white light emitting layer having a blue light emitting portion, a green light emitting portion, and a red light emitting portion. In addition, though all light emitting units may have the same structure, part of the light emitting units may have other structure. For example, by setting the first light emitting unit to the orange light emitting unit and setting the second light emitting unit to the blue-green light emitting unit, the MPE light emitting device, which emits white light may be made.

For the display unit including the MPE light emitting device, color display is enabled by arranging color conversion layers, color filters or the like in the positions corresponding to the MPE light emitting device in the region segmented by black matrix on the sealing substrate according to need.

Further, in the display unit having any light emitting device of (1) to (3), by setting the thickness difference between the thinnest portion and the thickest portion of the transparent resin layer 16 to 10 μm or less, the amount of light shielded by the black matrix 23 can be uniform, luminance unevenness can be improved, and viewing angle characteristics can be improved.

For the arrangement of the organic light emitting devices in the foregoing embodiment and examples, it is needless to say that the lines and the columns thereof may be reversible.

It should be understood by those skilled in the art that various modifications, combinations, sub-combinations and alternations may occur depending on design requirements and other factors insofar as they are within the scope of the appended claims or the equivalents thereof.

The invention claimed is:

1. A display unit comprising:
a driving panel having a plurality of light emitting devices arranged in a grid on a device substrate;
a sealing panel including a sealing substrate; and
a transparent resin layer which is sandwiched between the sealing panel and the driving panel and has a thickness $L_1$ satisfying Mathematical formula 1

$$L_1 \leq \frac{\{(L_{PITCH} - L_{CF}) + (L_{CF} - L_{EL})/2\} + HK}{\tan\{\sin^{-1}\left(\frac{1}{n}\right)\}}$$

wherein,
$L_{PITCH}$ is a length between the center of a first black matrix located between a first color filter and a second color filter and the center of a second black matrix located between the second color filter and a third color filter,
$L_{CF}$ is a length of a color filter,
$L_{EL}$ is a length of an organic layer,
H is a point at the end of an organic light emitting device corresponding to the second color filter that is adjacent to the an organic light emitting device corresponding to said first color filter,
K is a point at the opposite end of the organic light emitting device where H is located, and
n is a refractive index of the transparent resin layer.

2. A display unit according to claim 1, wherein the driving panel:
red, green, and blue light emitting devices arranged in a first direction of the grid,
concolorous light emitting devices arranged in a second direction of the grid,
red, green, and blue color filters arranged in the first direction of the grid in the sealing panel, and
concolorous color filters arranged in the second direction of the grid correspondingly to the position where the light emitting devices are arranged.

3. A display unit according to claim 1, wherein:
the plurality of light emitting devices in the driving panel are white light emitting devices,
red, green, and blue color filters are arranged in the sealing panel in a first direction of the grid, and
concolorous color filters are arranged in a second direction of the grid correspondingly to the position where the light emitting devices are arranged.

4. A display unit according to claim 1, wherein:
the plurality of light emitting devices in the driving panel are blue light emitting devices,
red conversion films, green conversion films, and blue light transmission regions are arranged in a first direction of the grid in the sealing panel, and concolorous conversion films or transmission regions are arranged in a second direction of the grid correspondingly to the position where the blue light emitting devices are arranged.

5. A display unit according to claim 1, wherein:
the light emitting device in the driving panel includes two or more layered light emitting units,
an insulating charge generation layer between the light emitting units,
red, green, and blue color filters are arranged in a first direction of the grid in the sealing panel and
concolorous color filters are arranged in a second direction of the grid correspondingly to the position where the light emitting devices are arranged.

6. A display unit according to claim 1, wherein a difference in thickness between the thinnest portion and the thickest portion of the transparent resin layer is 10 µm or less.

7. A display unit according to claim 1, wherein a refractive index of the transparent resin layer is from 1.3 to 2.2.

8. A display unit according to claim 1, wherein an in-plane color difference of the sealing panel is in the range of $\Delta_{u'v'} \leqq 0.006$ in the CIE (Capillary Ion Elecrophoresis) chromaticity diagram.

9. A method of manufacturing a display unit comprising the steps of:
bonding a driving panel having a plurality of light emitting devices arranged in a grid on a device substrate and a sealing panel including a sealing substrate with a transparent resin layer inbetween,
adhering the driving panel and the sealing panel with the transparent resin layer so that the transparent resin layer has a thickness $L_1$ satisfying Mathematical formula 1

$$L_1 \leq \frac{\{(L_{PITCH} - L_{CF}) + (L_{CF} - L_{EL})/2\} + HK}{\tan\{\sin^{-1}(\frac{1}{n})\}}$$

wherein,
$L_{PITCH}$ is a length between the center of a first black matrix located between a first color filter and a second color filter and the center of a second black matrix located between the second color filter and a third color filter,
$L_{CF}$ is a length of a color filter,
$L_{EL}$ is a length of an organic layer,
H is a point at the end of an organic light emitting device corresponding to the second color filter that is adjacent to the an organic light emitting device corresponding to said first color filter,
K is a point at the opposite end of the organic light emitting device where H is located, and
n is a refractive index of the transparent resin layer.

10. A method of manufacturing a display unit according to claim 9, wherein:
the driving panel includes a step of arranging red, green, and blue light emitting devices in a first direction of the grid, and arranging concolorous light emitting devices in a second direction of the grid on the device substrate, and
the sealing panel includes a step of arranging red, green, and blue color filters in the first direction of the grid, and arranging concolorous color filters in the second direction of the grid correspondingly to the position where the light emitting devices are arranged.

11. A method of manufacturing a display unit according to claim 9, wherein:
the driving panel includes a step of forming a plurality of light emitting devices capable of emitting white light on the device substrate, and
the sealing panel includes a step of arranging red, green, and blue color filters in a first direction of the grid, and arranging concolorous color filters in a second direction of the grid correspondingly to the position where the light emitting devices are arranged.

12. A method of manufacturing a display unit according to claim 9, wherein:
the driving panel includes a step of forming a plurality of light emitting devices capable of emitting blue light, and
the sealing panel includes a step of arranging red conversion films, green conversion films, and blue light transmission regions in a first direction of the grid and arranging concolorous conversion films or transmission regions in a second direction of the grid correspondingly to the position where the light emitting devices are arranged.

13. A method of manufacturing a display unit according to claim 9, wherein:
the light emitting devices include a step of layering (a) a first light emitting unit on the device substrate, (b) an insulating charge generation layer on the first light emitting unit and (c) a second light emitting unit on the insulating charge generation layer at least once, and
the sealing panel includes a step of arranging red, green, and blue color filters in a first direction of the grid, and arranging concolorous color filters in a second direction of the grid correspondingly to the position where the light emitting devices are arranged.

* * * * *